United States Patent
Gean et al.

(10) Patent No.: US 10,284,728 B1
(45) Date of Patent: May 7, 2019

(54) ADAPTIVE PROXIMITY THRESHOLDS FOR DYNAMIC HOWLING SUPPRESSION

(71) Applicant: MOTOROLA SOLUTIONS, INC., Chicago, IL (US)

(72) Inventors: Nissim Gean, Netanya (IL); Pavel Livshits, Modiyin (IL); Bar Yamin, Mazkeret Batya (IL)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/901,690

(22) Filed: Feb. 21, 2018

(51) Int. Cl.
| | |
|---|---|
| *H04M 1/20* | (2006.01) |
| *H04B 1/64* | (2006.01) |
| *H04M 9/08* | (2006.01) |
| *H03G 3/32* | (2006.01) |
| *G10L 21/0232* | (2013.01) |
| *H04R 29/00* | (2006.01) |

(52) U.S. Cl.
CPC ......... *H04M 9/085* (2013.01); *G10L 21/0232* (2013.01); *H03G 3/32* (2013.01); *H04R 29/001* (2013.01)

(58) Field of Classification Search
CPC ........ H04M 9/085; H04M 1/605; H04M 1/20; H04M 1/6033; H04R 29/001; H03G 3/32; H04B 1/64; G10L 21/0232
See application file for complete search history.

(56) References Cited

U.S. PATENT DOCUMENTS

| | | | |
|---|---|---|---|
| 9,209,909 B2 * | 12/2015 | Booij | H04B 11/00 |
| 9,667,284 B1 | 5/2017 | Gean et al. | |
| 10,154,149 B1 * | 12/2018 | Gean | H04M 9/085 |
| 2008/0285774 A1 * | 11/2008 | Kanamori | H04R 3/02 |
| | | | 381/94.3 |
| 2011/0206226 A1 * | 8/2011 | Pandey | H04R 25/453 |
| | | | 381/317 |
| 2016/0139241 A1 * | 5/2016 | Holz | H04B 17/318 |
| | | | 367/128 |
| 2018/0068672 A1 * | 3/2018 | Reuter | H04M 9/082 |
| 2018/0115639 A1 * | 4/2018 | Yen | H04M 1/72569 |

* cited by examiner

*Primary Examiner* — Andrew Wendell
(74) *Attorney, Agent, or Firm* — Michael Best & Friedrich LLP (57) ABSTRACT

Devices and methods for howling suppression. One method includes receiving, via a microphone, an acoustic signal from a communication device operating in an acoustic field with the microphone. The method includes determining a reflection pattern for the acoustic field based on the acoustic signal, and determining an acoustic characteristic for the acoustic field based on the reflection pattern. The method includes determining, based on the acoustic characteristic, a plurality of howling zones for the acoustic field, each zone defined by first and second proximity thresholds. The method includes, for each of the howling zones, determining an attenuation level for the zone based on the proximity thresholds and the acoustic characteristic. The method includes determining a distance between the microphone and the communication device, selecting one of the howling zones based on the distance, and adjusting a volume of a loudspeaker based on the attenuation level for the selected howling zone.

18 Claims, 6 Drawing Sheets

ADAPTIVE PROXIMITY THRESHOLDS FOR DYNAMIC HOWLING SUPPRESSION

BACKGROUND OF THE INVENTION

Wireless communication systems, for example, half-duplex communication systems, may experience problems when a receiving communication device is in proximity to a transmitting communication device. For example, a microphone of the transmitting communication device may receive a feedback signal generated by a speaker of the receiving communication device. The feedback signal may continue to circulate and grow in an unstable loop leading to a phenomenon known as howling. When howling occurs desired communications are often drowned out or otherwise obfuscated.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

As noted, the use of audio communication devices near one another can lead to acoustic feedback loops known as howling. To stop a howling condition, the feedback loop must be broken. For example, one way to stop howling is to stop transmissions from the transmitting communication device. However, ceasing transmission has the same effect as the howling condition—preventing communication between the transmitting user and the receiving user. Another approach to stopping a howling condition is to reduce or eliminate the audio feedback source. The distance between the transmitting device and the source of the audio feedback could be increased until the sound level from the audio feedback source at a microphone in the transmitting device is reduced below a level where the microphone generates a discernable output. However, this may not be possible when the users of both devices need to work in proximity to one another (for example, when public safety personnel are responding to an emergency situation). To address these problems, some devices suppress howling by automatically lowering the volume of their speakers, to reduce the possibility of generating audio feedback.

One current method for howling suppression is described in U.S. Pat. No. 9,667,284. The method described uses a set of proximity thresholds and the distance between the transmitting and receiving devices to identify howling sources and automatically suppress howling. The distance between the devices is compared to the thresholds, and an appropriate mitigation action (for example, turning down a loudspeaker volume or adjusting a microphone sensitivity) is taken based on the comparison. However, a single set of predefined proximity thresholds are used in all cases. The predefined thresholds do not take into account the acoustic environment in which the devices are operating when howling occurs. In order to define the single set of proximity thresholds, assumptions are made about the acoustic environment. For example, the thresholds may be defined assuming an average or typical acoustic environment that is neither open nor enclosed, neither clear nor cluttered. This single set of fixed thresholds therefore does not account for the differences between various acoustic environments. Such assumptions may result in howling suppression that works better in one type of acoustic environment (for example, outdoors) than in another type (for example, an enclosed room). For example, audio from a loudspeaker may be turned down further than necessary, or may not be turned down enough (for example, resulting in intermittent howling or howling that is less severe, yet still present). Accordingly, systems and methods are provided herein for, among other things, adaptive proximity thresholds for dynamic howling suppression.

Rather than using fixed thresholds, embodiments provided herein adapt the proximity thresholds to the current acoustic environment of the devices to dynamically suppress howling. Embodiments presented herein use ultrasonic transmissions from communication devices to make determinations about the acoustic environment. For example, a communication device receiving ultrasonic transmissions from another communication device can use the received transmissions to determine whether an acoustic environment is more enclosed or more open, and set the proximity thresholds accordingly based on the acoustic environment. Using such embodiments, more effective howling suppression is achieved. Such embodiments also allow for howling suppression to remain effective as communication devices move in and out of different acoustic environments (for example, as a group of police officers move through a complex of buildings, entering and leaving enclosed spaces of different sizes).

One example embodiment provides a communication device. The device includes a microphone, a loudspeaker, and an electronic processor communicatively coupled to the microphone and the loudspeaker. The electronic processor is configured to receive, via the microphone, an acoustic signal from a second communication device operating in an acoustic field with the communication device. The electronic processor is configured to determine a reflection pattern for the acoustic field based on the received acoustic signal. The electronic processor is configured to determine an acoustic characteristic for the acoustic field based on the reflection pattern. The electronic processor is configured to determine, based on the acoustic characteristic, a plurality of howling zones for the acoustic field. Each of the plurality of howling zones is defined by a first proximity threshold and a second proximity threshold. The electronic processor is configured to, for each of the plurality of howling zones, determine an attenuation level for the howling zone based on the first proximity threshold, the second proximity threshold, and the acoustic characteristic. The electronic processor is configured to determine a distance between the communication device and the second communication device. The electronic processor is configured to select one of the plurality of howling zones based on the distance. The electronic processor is configured to adjust a volume of the loudspeaker based on the attenuation level for the selected howling zone.

Another example embodiment provides a communication device. The device includes a microphone, a loudspeaker, and an electronic processor communicatively coupled to the microphone and the loudspeaker. The electronic processor is configured to receive, via the microphone, an acoustic signal from a second communication device operating in an acoustic field with the communication device. The electronic processor is configured to receive determine a reflection pattern for the acoustic field based on the received acoustic signal. The electronic processor is configured to determine an acoustic characteristic for the acoustic field based on the reflection pattern. The electronic processor is configured to determine, based on the acoustic characteristic, an attenuation level. The electronic processor is configured to adjust a volume of the loudspeaker based on the attenuation level.

Another example embodiment provides a method for dynamic howling suppression. The method includes receiving, via a microphone, an acoustic signal from a communication device operating in an acoustic field with the microphone. The method includes determining, with an electronic processor, a reflection pattern for the acoustic field based on the received acoustic signal. The method includes determining an acoustic characteristic for the acoustic field based on the reflection pattern. The method includes determining, based on the acoustic characteristic, a plurality of howling zones for the acoustic field, each of the plurality of howling zones defined by a first proximity threshold and a second proximity threshold. The method includes, for each of the plurality of howling zones, determining an attenuation level for the howling zone based on the first proximity threshold, the second proximity threshold, and the acoustic characteristic. The method includes determining a distance between the microphone and the communication device. The method includes selecting one of the plurality of howling zones based on the distance. The method includes adjusting a volume of a loudspeaker based on the attenuation level for the selected howling zone.

For ease of description, some or all of the example systems presented herein are illustrated with a single exemplar of each of its component parts. Some examples may not describe or illustrate all components of the systems. Other example embodiments may include more or fewer of each of the illustrated components, may combine some components, or may include additional or alternative components.

Figure 1:
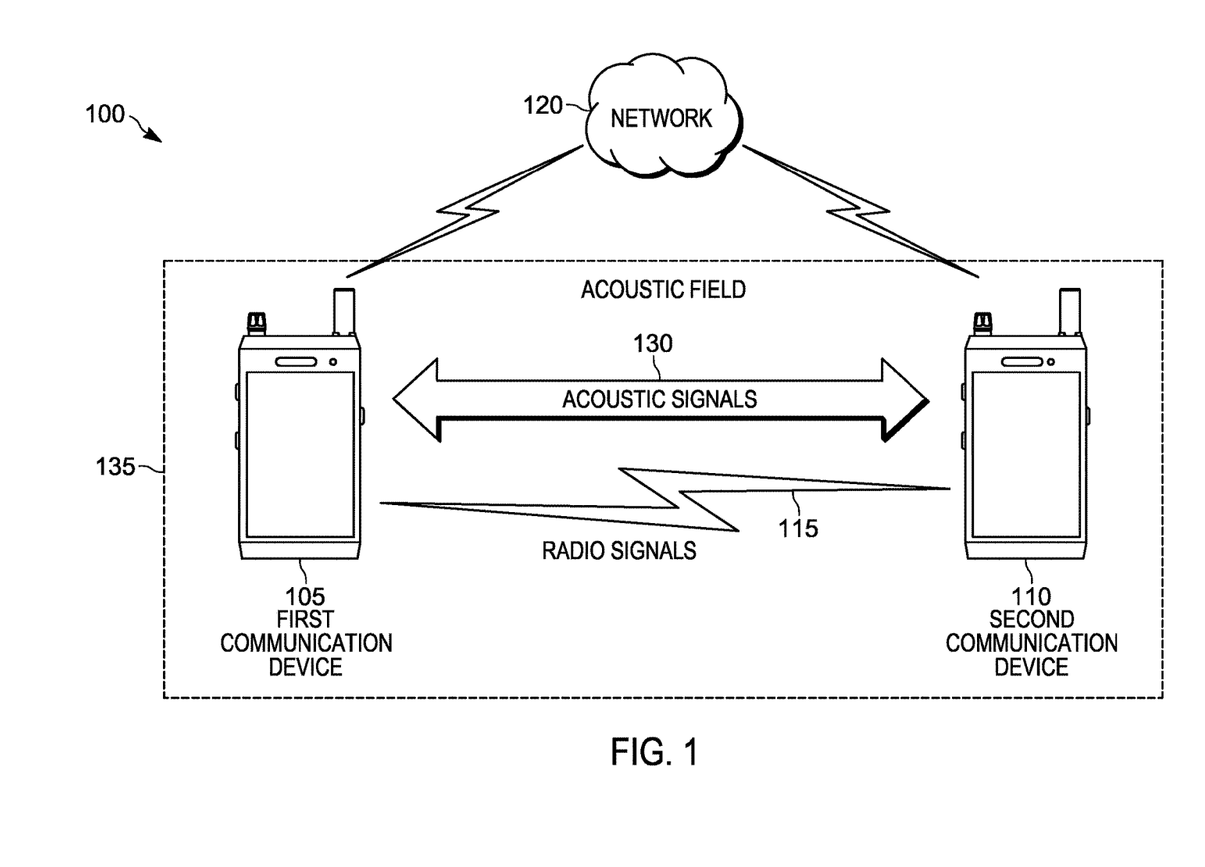
FIG. 1 is a diagram of a communication system, in accordance with some embodiments.

FIG. 1 illustrates an example communication system 100. The communication system 100 includes a first communication device 105 and a second communication device 110.

The first communication device 105 and the second communication device 110, both described more particularly below with respect to FIG. 2, transmit and receive voice and data to each other and to other communication devices (not shown) using radio signals 115. In some embodiments, the first communication device 105 and the second communication device 110 are communicatively coupled via a network 120. The network 120 is an electronic communications network including wireless and wired connections. The network 120 may be implemented using a wide area network, for example, the Internet, a local area network, for example, a Bluetooth™ network or Wi-Fi, a Long Term Evolution (LTE) network, a Global System for Mobile Communications (or Groupe Spécial Mobile (GSM)) network, a Code Division Multiple Access (CDMA) network, an Evolution-Data Optimized (EV-DO) network, an Enhanced Data Rates for GSM Evolution (EDGE) network, a 3G network, a 4G network, and combinations or derivatives thereof. In some embodiments, the network 120 includes a land mobile radio (LMR) network. For ease of description, only two communication devices are illustrated in FIG. 1. Some embodiments of the communication system 100 include additional electronic communication devices, which may communicate directly, over the network 120, or both.

In some embodiments, the first communication device 105 and the second communication device 110 provide push-to-talk functionality. Push-to-talk is a method of transmitting audio communications over a half-duplex communication channel. In some embodiments, the network 120 includes hardware and software suitable for assigning the first communication device 105, the second communication device 110, other communication devices (not shown), or combinations thereof to one or more talk groups and facilitating communications therebetween. For example, the network 120 may, upon receiving a request from one of the communication devices, establish push-to-talk channels between two or more communication devices based on talk group identifiers, device identifiers, or both. In some embodiments, push-to-talk communications occurs between the communication devices without the involvement of the network 120.

As illustrated in FIG. 1, the first communication device 105 and the second communication device 110 may be handheld communication devices, for example, mobile telephones (including smart telephones), portable two-way radios, converged devices including cellular and land mobile radio communications, smart watches or other smart wearables, or other portable electronic devices configured to communicate over the network 120. The first communication device 105, the second communication device 110, or both may alternatively be a mounted or stationary communication device, for example, a landline telephone, a speakerphone, or a communication device installed in a vehicle. For example, in some embodiments, the first communication device 105 may be a handheld cellular telephone carried by public safety personnel, for example, police officers. The second communication device 110 may be a cellular communication device installed in a public safety vehicle, for example, a police vehicle. In another example, the first communication device 105 may be a smart telephone, and the second communication device 110 may be a landline speakerphone. Accordingly, the first communication device 105 and the second communication device 110 may be any type of communication device capable of communicating independent of or over the network 120. In some embodiments, the first communication device 105 and the second communication device 110 may be different types of communication devices.

As described in more detail below, the first communication device 105 and the second communication device 110 also produce acoustic signals 130 (for example, audible signals, ultrasonic signals, or both). As illustrated in FIG. 1, the first communication device 105 and the second communication device 110 may operate within the same acoustic field 135. The acoustic field 135 is an area, within which the microphone of one of the communication devices is capable of detecting acoustic signals 130 produced by the loudspeaker of the other communication device. The acoustic field 135 exists within a physical environment, and accordingly has acoustic characteristics. The acoustic field 135 may be in an open area (for example, the outdoors), an enclosed area (for example, a room or a vehicle), or a partially enclosed area (for example, a large indoor space). The physical environment of the acoustic field 135 may also include objects or structures that reflect sound waves.

As noted above, in some situations, when the first communication device 105 is in proximity to the second communication device 110 and the first communication device 105 is transmitting to the second communication device 110, the first communication device 105 may receive a feedback signal from the audio produced by the second communication device 110. The feedback signal may continue to circulate and grow in an unstable loop leading to a phenomenon known as howling. Accordingly, as described in detail below, the first communication device 105 and the second communication device 110 include hardware and software configured to identify and suppress howling. In some embodiments, the howling suppression hardware and software is similar to the hardware and software illustrated and described in U.S. Pat. No. 9,667,284 ("METHOD, DEVICE, AND SYSTEM FOR IDENTIFYING A HOWLING SOURCE AND SUPPRESSING HOWLING"), issued May 30, 2017, the entire contents of which are hereby incorporated by reference.

Figure 2:
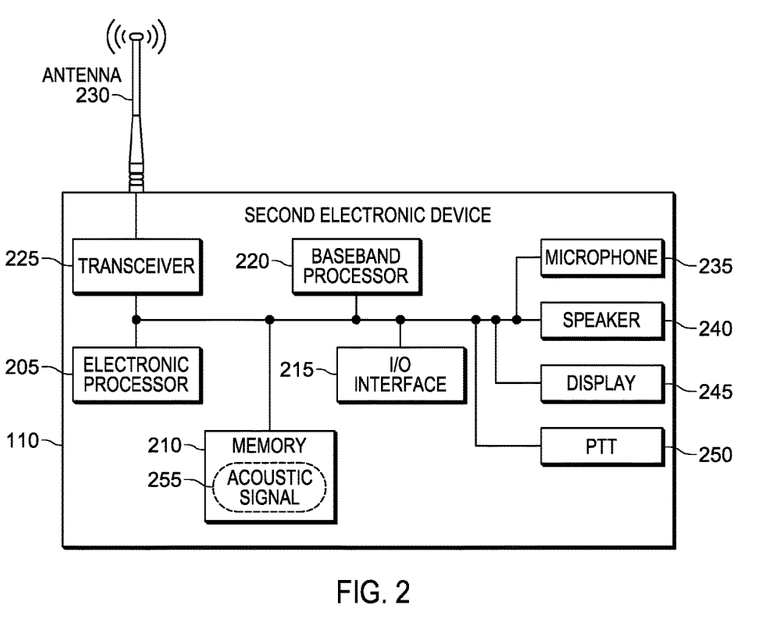
FIG. 2 is a diagram of a communication device included in the communication system of FIG. 1, in accordance with some embodiments.

FIG. 2 is a diagram of an example second communication device 110. In the embodiment illustrated, the second communication device 110 includes an electronic processor 205, a memory 210, an input/output interface 215, a baseband processor 220, a transceiver 225, an antenna 230, microphone 235, a loudspeaker 240, a display 245, and a push-to-talk (PTT) selection mechanism 250. The illustrated components, along with other various modules and components are coupled to each other by or through one or more control or data buses that enable communication therebetween. The use of control and data buses for the interconnection between and exchange of information among the various modules and components would be apparent to a person skilled in the art in view of the description provided herein. In some embodiments, the second communication device 110 includes fewer or additional components in configurations different from that illustrated in FIG. 2. For example, in some embodiments, the second communication device 110 includes multiple microphones, multiple speakers, or combinations thereof.

The electronic processor 205 obtains and provides information (for example, from the memory 210 and/or the input/output interface 215), and processes the information by executing one or more software instructions or modules, capable of being stored, for example, in a random access memory ("RAM") area of the memory 210 or a read only memory ("ROM") of the memory 210 or another non-transitory computer readable medium (not shown). The software can include firmware, one or more applications, program data, filters, rules, one or more program modules, and other executable instructions. The electronic processor 205 is configured to retrieve from the memory 210 and execute, among other things, software related to the control processes and methods described herein. The memory 210 can include one or more non-transitory computer-readable media, and includes a program storage area and a data storage area. The program storage area and the data storage area can include combinations of different types of memory, as described herein. In the embodiment illustrated, the memory 210 stores, among other things, one or more acoustic signals 255 (described in detail below).

The input/output interface 215 is configured to receive input and to provide system output. The input/output interface 215 obtains information and signals from, and provides information and signals to, (for example, over one or more wired and/or wireless connections) devices both internal and external to the second communication device 110.

The electronic processor 205 is configured to control the baseband processor 220 and the transceiver 225 to transmit and receive video and other data to and from the second communication device 110. The baseband processor 220 encodes and decodes digital data sent and received by the transceiver 225. The transceiver 225 transmits and receives radio signals to and from, for example, the network 120 using the antenna 230. The electronic processor 205, the baseband processor 220, and the transceiver 225 may include various digital and analog components, which for brevity are not described herein and which may be implemented in hardware, software, or a combination of both. Some embodiments include separate transmitting and receiving components, for example, a transmitter and a receiver, instead of a combined transceiver 225.

The microphone 235 is a transducer capable of sensing sound, converting the sound to electrical signals, and transmitting the electrical signals to the electronic processor 205. The electronic processor 205 processes the electrical signals received from the microphone 235 to produce an audio stream, which may be transmitted to other devices via the transceiver 225. The loudspeaker 240 is a transducer for reproducing sound from electrical signals (for example, generated from a received audio stream) received from the electronic processor 205. The microphone 235 and the loudspeaker 240 support both ultrasonic and audible frequencies. In some embodiments, the microphone 235 and the loudspeaker 240 have single transducers that support both ultrasonic and audible frequencies. Alternatively, in some embodiments, the microphone 235 and the loudspeaker 240 have separate transducers for ultrasonic and audible frequencies. In some embodiments, the microphone 235, the loudspeaker 240, or both may be integrated in a single housing with the other components (for example, in a portable hand-held radio). In some embodiments, the microphone 235, the loudspeaker 240, or both are present in an accessory device (for example, a remote speaker microphone (RSM)) connect via a wired or wireless connection to the second communication device 110.

The display 245 is a suitable display, for example, a liquid crystal display (LCD) touch screen, or an organic light-emitting diode (OLED) touch screen. In some embodiments, the second communication device 110 implements a graphical user interface (GUI) (for example, generated by the electronic processor 205, from instructions and data stored in the memory 210, and presented on the display 245), that enables a user to interact with the second communication device 110.

The push-to-talk selection mechanism 250 allows a user of the first communication device 105 to initiate push-to-talk half-duplex voice communications to one or more other communication devices, either directly or over the network 120. For example, when the electronic processor 205 detects that the push-to-talk selection mechanism 250 is enabled, the electronic processor 205 controls the transceiver 225 to transmit signals created by sound detected by the microphone 235 (for example, as a half-duplex communication signal). When the electronic processor 205 detects that the push-to-talk selection mechanism 250 is no longer enabled (for example, has been released), the transceiver 225 stops transmitting the signals. In some embodiments, the push-to-talk selection mechanism 250 is a mechanical button, key, switch, or knob. In some embodiments, the push-to-talk selection mechanism 250 is provided as part of a graphical user interface (for example, a virtual button) presented on the display 245.

The first communication device 105 includes similar components as described above, and is configured similarly to the second communication device 110. In some embodiments, the second communication device 110 is identical to the first communication device 105.

Figure 3:
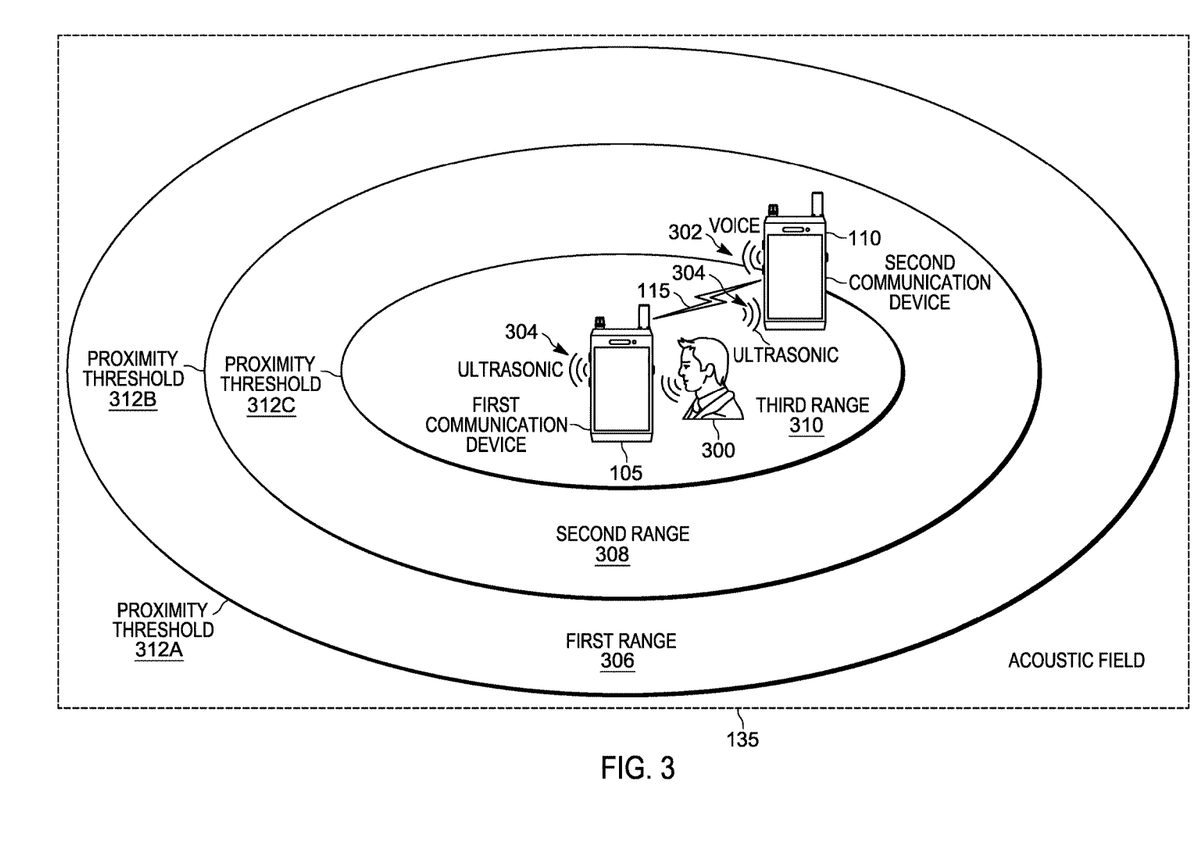
FIG. 3 is a diagram illustrating the operation of the communication system of FIG. 1, in accordance with some embodiments.

In some situations, when the first communication device 105 is operating in close proximity to the second communication device 110, a howling condition may develop. As noted above, in some embodiments, the first communication device 105, the second communication device 110, or both, are configured to detect and suppress howling using proximity thresholds. For example, as illustrated in FIG. 3, the first communication device 105 and the second communication device 110 are operating within the acoustic field 135. A user 300 is transmitting voice messages to the second communication device 110 using the first communication device 105. Sound waves produced by the voice of the user 305 are picked up by the microphone of the first communication device 105 and encoded into transmittable signals, which are transmitted via the radio signals 115 to the second communication device 110. The second communication device 110 receives the signals, decodes them, and plays them as voice (that is, sound in the audible frequency range) audio 302 through its loudspeaker 240. In some cases, the microphone of the first communication device 105 may pick up the voice audio 302, encode it, and transmit it, which creates an audio feedback loop (a howling condition). As described below, the first communication device 105 may identify whether the second communication device 110 is a howling source (that is, an actual or current howling source or a potential howling source) based on the distance between the first communication device 105 and the second communication device 110.

In the example illustrated in FIG. 3, the first communication device 105 is located inside a first range 306 (defined by a proximity threshold 312A), inside the second range 308 (defined by a proximity threshold 312B), and inside the third range 310 (defined by a proximity threshold 312C). The proximity thresholds 312A, 312B, 312C are set at predetermined distances from the first communication device 105 to define the first range 306, the second range 308, and the third range 310. In order to detect howling, or the potential for howling, the first communication device 105 determines the distance between the first communication device 105 and the second communication device 110 using ultrasonic signals 304. The distance is compared to the proximity thresholds 312A, 312B, 312C (that is, distance thresholds) to determine whether a device is close enough to be a source of howling and, if so, to determine how to suppress the howling. Each of the communication devices is configured to send and receive ultrasonic signals 304 and to compare the received signals to the sent signals to determine a distance between the devices. For example, the electronic processor 205 may compare the signal strengths of the sent and received signals, or calculate the time of flight for the ultrasonic signals 304 to determine the distance.

In the example illustrated in FIG. 3, because the second communication device 110 is located inside of the third range 310 (that is, corresponding to the proximity threshold 312C), the first communication device 105 identifies the second communication device 110 as a howling source. In some embodiments, the second communication device 110 identifies itself as a howling source by measuring the reflection pattern of the transmitted ultrasonic signal 304 from the first communication device 105. The first communication device 105, the second communication device 110, or a combination thereof may take one or more actions to suppress (for example, prevent, stop, or limit) howling associated with the second communication device 110. For example, the sensitivity of the microphone in the first communication device 105 may be reduced to prevent limit picking up the voice audio 302, or the volume of the speaker of the second communication device 110 may be reduced to prevent the voice audio 302 from reaching the microphone of the first communication device 105.

The howling suppression technique described above with respect to FIG. 3 uses predefined values for the proximity thresholds 312A, 312B, 312C that do not take into account the characteristics of the acoustic environment of the acoustic field 135. Taking such characteristics into account can improve howling suppression. For example, howling caused by a device at a particular distance in a closed-space environment is more severe than the howling caused by the same device and the same distance in an open-space environment. Thus, more intense suppression measures may be needed to suppress howling in a closed-space environment than in an open-space environment. In another example, portable communication devices may move in and out of different types of acoustic environments as they are being used, and a single set of proximity thresholds may not be effective to suppress howling in all of the environments. As a consequence, there is a need for dynamically suppressing howling using adaptive proximity thresholds that are based on the acoustic environment.

Figure 4:
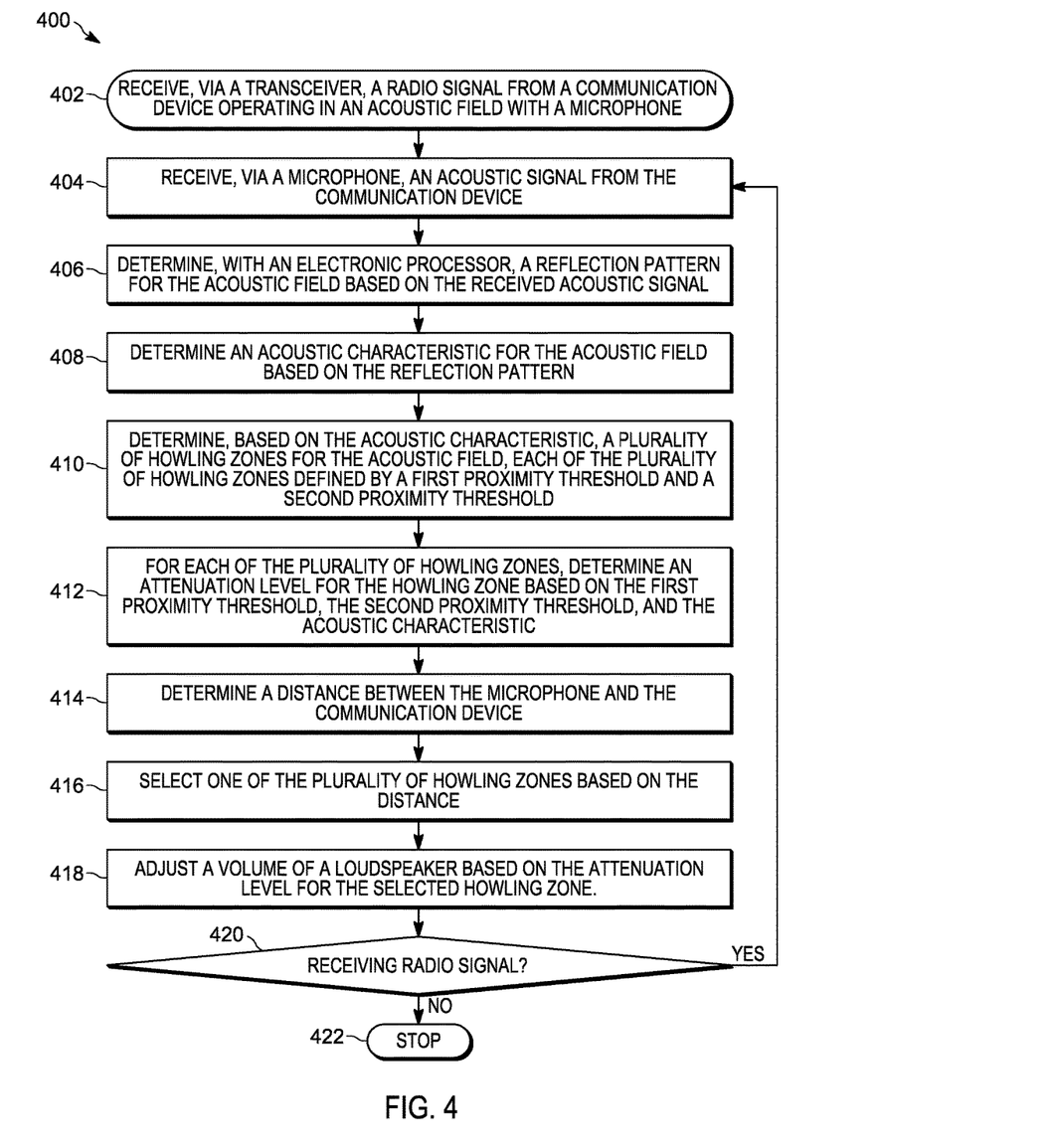
FIG. 4 is a flowchart of a method for dynamic howling suppression, in accordance with some embodiments.

FIG. 4 illustrates an example method 400 for dynamic howling suppression. The method 400 is described with respect to FIGS. 5 and 6. The method 400 is described as being performed by the second communication device 110 and, in particular, the electronic processor 205. However, it should be understood that in some embodiments, portions of the method 400 may be performed by other devices, including for example, the first communication device 105 or another device included in the communication system 100. For ease of description, portions of the method 400 are described in terms of a single howling source. It should be understood that embodiments of the method 400 may be used to identify and suppress multiple howling sources.

In the example provided in FIG. 4, the method 400 begins at block 402, with the electronic processor 205 receiving, via the transceiver 225, a radio signal from a communication device (for example, the first communication device 105) operating in an acoustic field (for example, the acoustic field 135) with the second communication device 110 and it's microphone 235.

At block 404, the electronic processor 205 receives, via the microphone 235, an acoustic signal from the first communication device 105. In some embodiments, the acoustic signal is an ultrasonic signal. Ultrasonic signals are used because they are inaudible to human ears and will not contribute to worsening the howling condition.

Figure 5:
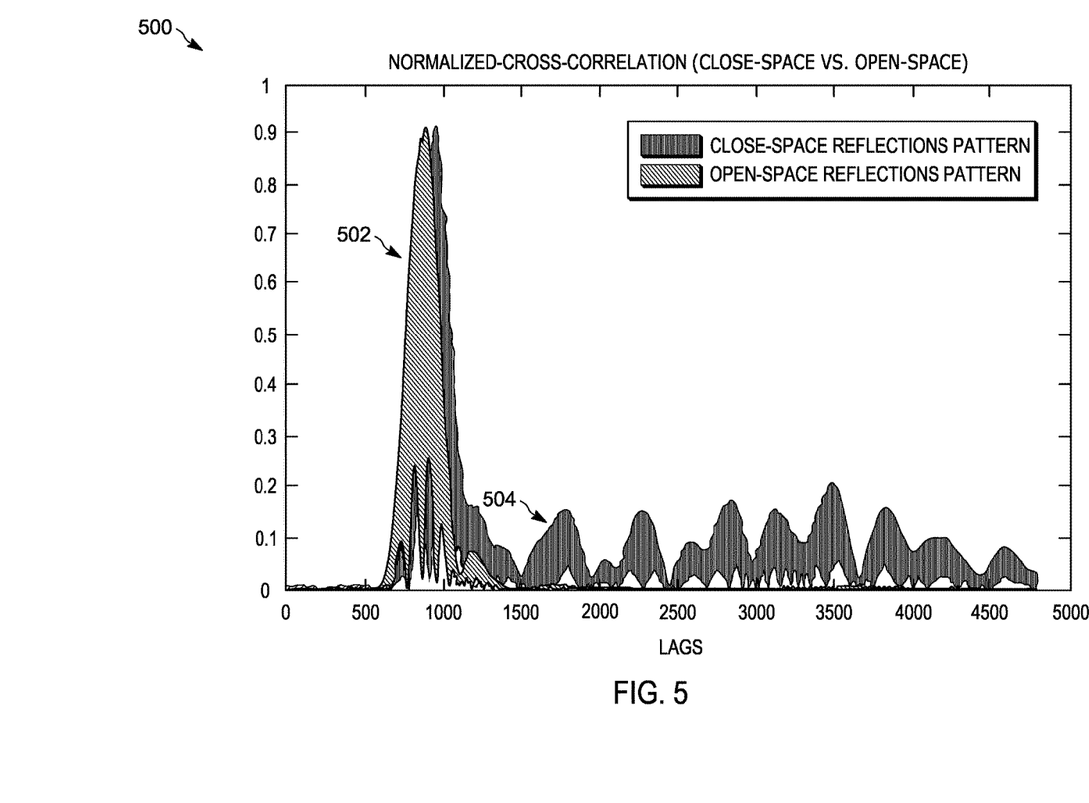
FIG. 5 is a chart illustrating acoustic reflection patterns produced according to the method of FIG. 4, in accordance with some embodiments.

At block 406, the electronic processor 205 determines a reflection pattern for the acoustic field 135 based on the received acoustic signal. In some embodiments, reflection patterns are determined by comparing the received acoustic signal to an acoustic signal stored in the memory 210 (for example, the stored acoustic signal 255). The stored acoustic signal 255 is the acoustic signal that the communication devices transmit to detect and suppress howling, as described above. In some embodiments, a reflection pattern is determined for the acoustic field 135 by calculating a normalized cross correlation function between the received acoustic signal and the stored acoustic signal 255. FIG. 5 includes a chart 500, which illustrates two example reflection patterns 502, 504. The reflection pattern 502 is representative of the acoustic signal being transmitted and received in an open-space environment. The reflection pattern 504 is representative of the acoustic signal being transmitted and received in a closed-space environment.

At block 408, the electronic processor 205 determines an acoustic characteristic (for example, open-space or closed-space) for the acoustic field 135 based on the reflection pattern. In some embodiments, the electronic processor 205 determines an acoustic characteristic by measuring at least one of a density, a strength, and a reverberation time of the reflection pattern. In such embodiments, the values for the density, strength, and reverberation time may be compared to known or experimentally determined values to identify an acoustic characteristic for the acoustic field 135. In some embodiments, the electronic processor 205 determines an acoustic characteristic by determining a quantity of reflections in the reflection pattern. For example, as illustrated in FIG. 5, the closed-space environment causes a larger quantity of reflections than the open-space environment.

Figure 6:
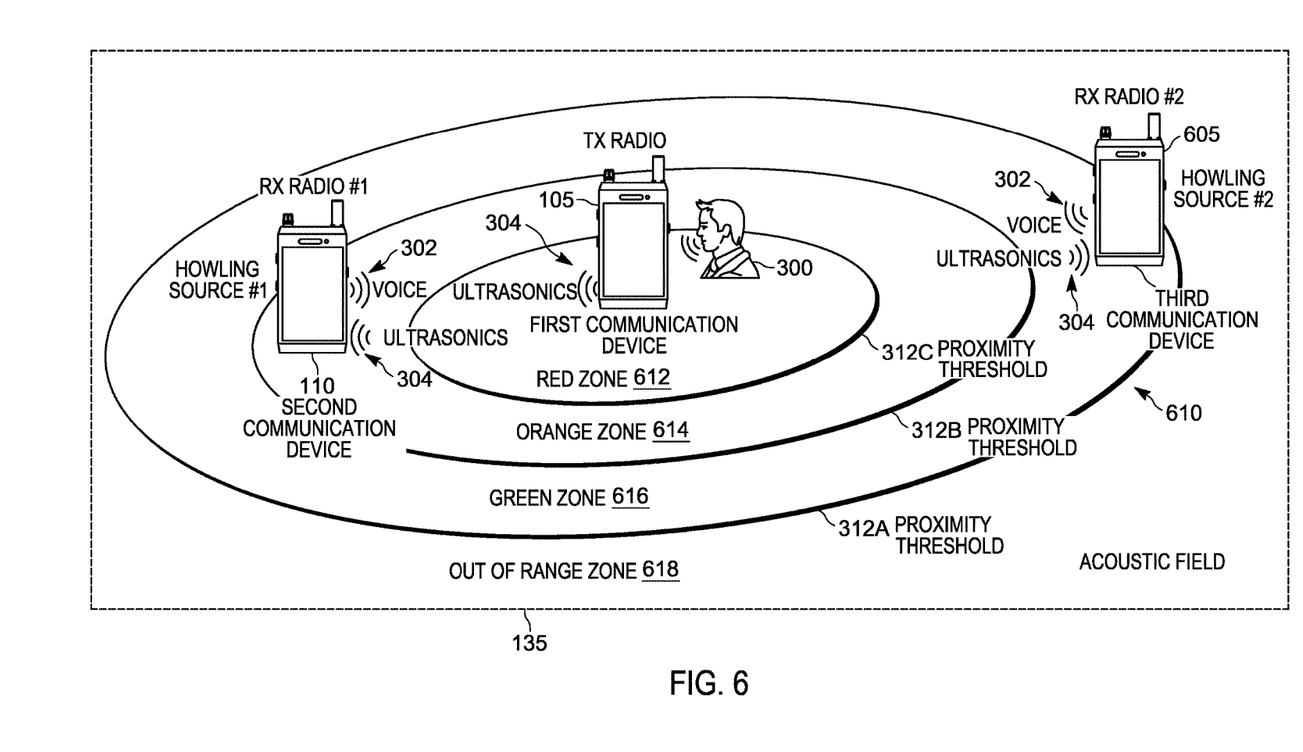
FIG. 6 is a diagram illustrating the operation of the communication system of FIG. 1 within dynamic howling zones, in accordance with some embodiments.

At block 410, the electronic processor 205 determines, based on the acoustic characteristic, a plurality of howling zones for the acoustic field 135. A howling zone is a range of distance from the transmitting device, similar to the ranges illustrated in FIG. 3. FIG. 6 illustrates four howling zones: a red zone 612, an orange zone 614, a green zone 616, and an out-of-range zone 618. Each of the plurality of howling zones 612 through 618 is defined by a first proximity (distance) threshold and a second proximity (distance) threshold (for example, the proximity thresholds 312A, 312B, 312C). The proximity thresholds 312A, 312B, 312C are set at predetermined distances from the second communication device 110 based on the acoustic characteristic (determined at block 408). For example, in an open-space environment, the howling zones may be larger than in a closed space environment. As illustrated, FIG. 6 shows four howling zones. However, more or fewer howling zones may be determined, depending on the acoustic characteristic.

At block 412, the electronic processor 205 determines an attenuation level for each of the plurality of howling zones. The attenuation level is used to determine how much the audio feedback from the voice signals 302 should be attenuated to effectively suppress howling. For example, as illustrated in FIG. 6, the red zone 612 may have the highest level of attenuation, which the orange zone 614, green zone 616, and out-of-range zone 618 have progressively lower levels of attenuation. Each of the proximity thresholds 312A, 312B, 312C is progressively farther away from the second communication device 110. Because sound intensity varies with distance, the attenuation level is set based on the range of distance covered by each of the howling zones, as defined by the first proximity threshold for the howling zone and the second proximity threshold for the howling zone.

At block 414, the electronic processor 205 determines a distance between the microphone 235 and the communication device. In some embodiments, the electronic processor 205 determines the distance by comparing the signal strengths of the sent and received ultrasonic signals 304, or calculating the time of flight for the ultrasonic signals 304. In some embodiments, the electronic processor 205 determines the distance between the devices based on a signal strength of the received radio signal. In some embodiments, the distance is determined using geolocation techniques.

Regardless of how the distance is determined, at block 416, the electronic processor 205 selects one of the plurality of howling zones based on the distance. In some embodiments, the electronic processor 205 compares the distance to the proximity thresholds for the plurality of howling zones and selects a howling zone based on which thresholds the distance falls between.

As noted above (at block 412), each howling zone has an assigned attenuation level. At block 418, the electronic processor 205 adjusts the volume of the loudspeaker 240 based on the attenuation level for the selected howling zone. In some embodiments, the electronic processor 205 may transmit the howling zone designation and attenuation level to the first communication device 105, which can use the information to lower the sensitivity of its microphone.

At block 420, the electronic processor 205 determines whether the transceiver 225 is still receiving the radio signal transmission from the first communication device 105. If the signal is no longer received, at block 422, the method stops. Otherwise, the electronic processor 205 continues to adapt the thresholds and dynamically suppress howling (repeating blocks 404 through 418 while the radio signal is being received).

In some alternative embodiments, the second communication device 110 is configured to determine an acoustic characteristic based on reflection patterns for the acoustic field 135 (at blocks 404 through 408), and determine the attenuation level based on the characteristic without first determining a plurality of howling zones.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 20%, in another embodiment within 10%, in another embodiment within 2% and in another embodiment within 1%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A communication device comprising:
   a microphone;
   a loudspeaker; and
   an electronic processor communicatively coupled to the microphone and the loudspeaker, and configured to
      (a) receive, via the microphone, an acoustic signal from a second communication device operating in an acoustic field with the communication device;
      (b) determine a reflection pattern for the acoustic field based on the received acoustic signal;
      (c) determine an acoustic characteristic for the acoustic field based on the reflection pattern;
      (d) determine, based on the acoustic characteristic, a plurality of howling zones for the acoustic field, each of the plurality of howling zones defined by a first proximity threshold and a second proximity threshold;
      (e) for each of the plurality of howling zones, determine an attenuation level for the howling zone based on the first proximity threshold, the second proximity threshold, and the acoustic characteristic;
      (f) determine a distance between the communication device and the second communication device;
      (g) select one of the plurality of howling zones based on the distance; and
      (h) adjust a volume of the loudspeaker based on the attenuation level for the selected howling zone.

2. The communication device of claim 1, further comprising:
   a transceiver;
   wherein the electronic processor is configured to
      receive, via the transceiver, a radio signal from the second communication device; and
      while the transceiver is receiving the radio signal, repeat steps (a) through (h).

3. The communication device of claim 1, wherein the received acoustic signal is an ultrasonic signal.

4. The communication device of claim 1, wherein the electronic processor is configured to determine a reflection pattern for the acoustic field by calculating a normalized cross correlation function between the received acoustic signal and a stored acoustic signal.

5. The communication device of claim 1, wherein the electronic processor is configured to determine an acoustic characteristic for the acoustic field based on the reflection pattern by measuring at least one of the group consisting of a density, a strength, and a reverberation time of the reflection pattern.

6. The communication device of claim 1, wherein the electronic processor is configured to determine an acoustic characteristic for the acoustic field based on the reflection pattern by determining a quantity of reflections in the reflection pattern.

7. The communication device of claim 1, further comprising:
   a transceiver;
   wherein the electronic processor is configured to
      receive, via the transceiver, a radio signal from the second communication device; and
      determine the distance between the communication device and the second communication device based on a signal strength of the received radio signal.

8. The communication device of claim 1, wherein the first proximity threshold is a first distance from the communication device and the second proximity threshold is a second distance from the communication device.

9. A communication device comprising:
a microphone;
a loudspeaker; and
an electronic processor communicatively coupled to the microphone and the loudspeaker, and configured to
(a) receive, via the microphone, an acoustic signal from a second communication device operating in an acoustic field with the communication device;
(b) determine a reflection pattern for the acoustic field based on the received acoustic signal;
(c) determine an acoustic characteristic for the acoustic field based on the reflection pattern;
(d) determine, based on the acoustic characteristic, an attenuation level; and
(e) adjust a volume of the loudspeaker based on the attenuation level.

10. The communication device of claim 9, further comprising:
a transceiver;
wherein the electronic processor is configured to
receive, via the transceiver, a radio signal from the second communication device; and
while the transceiver is receiving the radio signal, repeat steps (a) through (e).

11. A method for dynamic howling suppression, the method comprising:
(a) receiving, via a microphone, an acoustic signal from a communication device operating in an acoustic field with the microphone;
(b) determining, with an electronic processor, a reflection pattern for the acoustic field based on the received acoustic signal;
(c) determining an acoustic characteristic for the acoustic field based on the reflection pattern;
(d) determining, based on the acoustic characteristic, a plurality of howling zones for the acoustic field, each of the plurality of howling zones defined by a first proximity threshold and a second proximity threshold;
(e) for each of the plurality of howling zones, determining an attenuation level for the howling zone based on the first proximity threshold, the second proximity threshold, and the acoustic characteristic;
(f) determining a distance between the microphone and the communication device;
(g) selecting one of the plurality of howling zones based on the distance; and
(h) adjusting a volume of a loudspeaker based on the attenuation level for the selected howling zone.

12. The method for dynamic howling suppression of claim 11, further comprising:
receiving, via a transceiver, a radio signal from the communication device; and
while receiving the radio signal, repeating steps (a) through (h).

13. The method for dynamic howling suppression of claim 11, wherein receiving an acoustic signal includes receiving an ultrasonic signal.

14. The method for dynamic howling suppression of claim 11, wherein determining a reflection pattern for the acoustic field includes calculating a normalized cross correlation function between the received acoustic signal and a stored acoustic signal.

15. The method for dynamic howling suppression of claim 11, wherein determining an acoustic characteristic for the acoustic field based on the reflection pattern includes measuring at least one of the group consisting of a density, a strength, and a reverberation time of the reflection pattern.

16. The method for dynamic howling suppression of claim 11, wherein determining an acoustic characteristic for the acoustic field based on the reflection pattern includes determining a quantity of reflections in the reflection pattern.

17. The method for dynamic howling suppression of claim 11, further comprising:
receiving, via a transceiver, a radio signal from the communication device; and
determining the distance between the microphone and the communication device based on a signal strength of the received radio signal.

18. The method for dynamic howling suppression of claim 11, wherein the first proximity threshold is a first distance from the communication device and the second proximity threshold is a second distance from the communication device.

* * * * *